United States Patent [19]

Rösner

[11] Patent Number: 5,600,162
[45] Date of Patent: Feb. 4, 1997

[54] DRAM-TYPE MEMORY CELL ARRANGEMENT ON A SUBSTRATE

[75] Inventor: Wolfgang Rösner, München, Germany

[73] Assignee: Siemens Aktiengesellschaft, Munich, Germany

[21] Appl. No.: 382,048

[22] PCT Filed: Jun. 23, 1993

[86] PCT No.: PCT/DE93/00542

§ 371 Date: Feb. 10, 1995

§ 102(e) Date: Feb. 10, 1995

[87] PCT Pub. No.: WO94/03898

PCT Pub. Date: Feb. 17, 1994

[30] Foreign Application Priority Data

Aug. 10, 1992 [DE] Germany .......................... 42 26 454.5

[51] Int. Cl.⁶ .......................... H01L 27/108; H01L 29/76; H01L 29/94; H01L 31/119
[52] U.S. Cl. .......................... 257/311; 257/296; 257/306; 257/905; 257/908
[58] Field of Search .................... 257/296, 306, 257/307, 308, 311, 905, 908

[56] References Cited

U.S. PATENT DOCUMENTS

| | | |
|---|---|---|
| 4,970,564 | 11/1990 | Kimura et al. |
| 5,091,761 | 2/1992 | Hiraiwa et al. |
| 5,138,412 | 8/1992 | Hieda . |
| 5,235,199 | 8/1993 | Hamamoto et al. ............ 257/306 |
| 5,247,196 | 9/1993 | Kimura ........................ 257/303 |
| 5,434,439 | 7/1995 | Ajika et al. .................. 257/309 |

FOREIGN PATENT DOCUMENTS

| | | |
|---|---|---|
| 3930639 | 5/1990 | Germany . |
| 4109299 | 10/1991 | Germany . |
| 2247105 | 2/1992 | United Kingdom . |

OTHER PUBLICATIONS

S. Yoshikawa et al., "Process Technologies For A High Speed 16MDRAM with Trench Type Cell", Symp. on VLSI–Technol. 1989, pp. 67–68.

S. Kimura et al., "A Diagonal Active–Area Stacked Capacitor DRAM Cell With Storage Capacitor On Bit Line", IEEE Transactions on Electron Devices, vol. 37, No. 3, Mar. 1990, pp. 737–743.

S. Kimura et al., "A New Stacked Capacitor DRAM Cell Characteraized By A Storage Capacitor On A Bit–Line Structure", IEDM 88, pp. 596–599.

M. Fukumoto et al., "Double Self–Aligned Contact Technology For Shielded Bit Line Type Stacked Capacitor Cell Of 166 MDRAM", IEICE Transactions, vol. E 74, No. 4, Apr. 1991, pp. 818–825.

*Primary Examiner*—Ngân V. Ngô
*Attorney, Agent, or Firm*—Hill, Steadman & Simpson

[57] ABSTRACT

In a DRAM cell arrangement, two memory cells which include an MOS transistor and a memory element are constructed in each case as a transistor pair (10) whose source areas are connected to one another and to a bitline (11). The MOS transistors have a linear arrangement of the drain area, the gate electrode and the source area which is aligned in the direction of the bitlines (11) and which is arranged essentially below a bitline (11). Adjoining the drain area in each case is a terminal area (13) which is arranged to the side of associated bitlines (11) and via which a cell contact to the memory element is formed. The cell arrangement is particularly suitable for buried-bitline-stacked-capacitor (BBSTC) DRAM cells.

8 Claims, 1 Drawing Sheet

DRAM-TYPE MEMORY CELL ARRANGEMENT ON A SUBSTRATE

BACKGROUND OF THE INVENTION

1. Field of the Invention

The present invention relates generally to a DRAM cell structure and more particularly to a stacked capacitor (STC) DRAM cell.

2. Description of the Related Art

In order to increase the integration density in DRAM cell arrangements, DRAM cells are optimized to a reduced space requirement, on the one hand, and the arrangement of the DRAM cells relative to one another in a DRAM cell arrangement is optimized on the other hand.

A DRAM cell having a reduced space requirement is the so-called stacked-capacitor DRAM cell. It comprises an MOS transistor and a storage capacitor, the MOS transistor being arranged in a silicon substrate and the storage capacitor comprising two doped polysilicon layers and a dielectric layer arranged therebetween, which are arranged on the surface of the substrate. In this case, the storage capacitor covers entirely or partially that area which is occupied by the transistor. The MOS transistor is referred to as a cell transistor.

A further reduction in the space requirement is achieved in the stacked-capacitor DRAM cell owing to the fact that the storage capacitor is arranged above a bitline. This variant of the stacked-capacitor DRAM cell is referred to as a buried-bitline-stacked-capacitor (BBSTC) DRAM cell. In this case, it is necessary to produce a connection between the MOS transistor and the storage node of the storage capacitor, that is to say that electrode of the storage capacitor on which the information is stored. Such a connection is referred to as a cell contact.

The arrangement of the cells is also interrelated with the circuitry for their activation. In order to read out the stored information, a wordline is activated, as a result of which all the transistors located on this line become conductive and thus cause the stored charges to flow off to an assigned bitline in each case. Subsequently, the voltages of two bitlines are compared in a read amplifier. The one bitline represents in this case the connection from the cell to be evaluated to the read amplifier, while no cell is permitted to be active at the other bitline for the time being (the second bitline is thus termed reference bitline). The first bitline is referred to as the addressed bitline; it is connected to a cell transistor whose gate is formed by the activated wordline. The reference bitline is also referred to as non-addressed. If the addressed and non-addressed bitlines are always located alternately next to one another, a pair of adjacent bitlines can be evaluated in each case by a read amplifier. This cell arrangement is referred to as a folded bitline.

S. Kimura et al, IEDM'88, pages 596 ff and S. Kimura et al, IEEE Trans. Elect. Dev., volume 37 (1990), pages 737 ff disclose a BBSTC-DRAM cell in which the channel area and source of the cell transistors extend at an angle of approximately 45° to the wordlines and the bitlines. The wordlines and the bitlines are arranged in this case at right angles to one another. The active areas are bent between the drain area and channel area. It is possible thereby for cell contacts to be opened during manufacture with the aid of a spacer technique in a self-adjusted fashion through the wordline and the bitline plane onto an $n^+$-doped area which merges, or extends into the drain area of the cell transistor.

The storage node is produced in an overlapping manner relative to this cell contact.

The known cell arrangement is a folded-bitline arrangement. The cell contacts are located relatively close to one another in this case. By contrast, the bitline contacts, which reach up to the source areas of the MOS transistors, are relatively far removed from one another because of the bent course of the active area. This results in the active areas being relatively closely spaced in the plane and only being separated from one another by field isolation, on the one hand, while, on the other hand, relatively large areas go unused.

SUMMARY OF THE INVENTION

The present invention addresses the problem of providing a DRAM cell arrangement with a more uniform utilisation of the area available in the plane of field isolation/active area of the MOS transistor. The cell arrangement is, in particular, suitable for buried-bitline-stacked-capacitor DRAM cells.

This problem is solved according to the invention in a DRAM cell arrangement in which bitlines are arranged in a bitline plane and word lines are arranged in a wordline plane, in which the MOS transistors, in two respective memory cells, each of which comprises an MOS transistor as the cell transistor and a memory element, are fashioned as transistor pairs whose source areas are connected to one another and, via a common bitline contact, to a bitline, in which the MOS transistors have a linear arrangement of the drain area, channel area and source area which is aligned in the direction of the bitlines and is arranged essentially below an associated bitline, in which a terminal area, via which a cell contact to the memory element exists, adjoins the drain area in each case, in which the terminal area is arranged in each case to the side of the associated bitline. In this case, the MOS transistors are constructed in two memory cells each, which respectively comprise an MOS transistor as the cell transistor and a memory element, as a transistor pair whose source areas are connected to one another and, via a common bitline contact, to a bitline. In this case, the MOS transistors have a linear arrangement of the drain area, the channel area and the source area, which is aligned in the direction of the bitlines and which is arranged essentially below an associated bitline. Adjoining the drain area of each MOS transistor is a terminal area via which a cell contact is provided to the memory element. The terminal area is arranged in each case to the side of the associated bitline. Owing to the linear arrangement in the MOS transistors, the current distribution in the cell transistor is homogeneous, and this has a favourable effect on the electrical characteristics of the memory cell. Owing to the lateral arrangement of the terminal areas relative to the respective drain areas, a high integration density is achieved in the cell arrangement.

It is particularly favourable in this case for the terminal areas adjoining the drain areas of a transistor pair to be arranged on opposite sides of the associated sides of the bitline, and for the transistor pairs to be arranged along each bitline in such a way that the terminal areas, which adjoin mutually facing drain areas of adjacent transistor pairs, be arranged on respectively opposite sides of the associated bitline. It is possible using this arrangement for the transistor pairs along a first bitline to be arranged offset relative to the transistor pairs along a second bitline, which is adjacent to the first bitline, in such a way that the gate electrodes, arranged above the channel area, of those MOS transistors along the first bitline, on whose drain areas the terminal areas on the side averted from the second bitline are arranged, and the electrodes of those transistors along the second bitline, on whose drain areas the terminal areas on the side averted from the first bitline are arranged, are arranged in pairs along a wordline in each case. In this arrangement, the wordlines extend perpendicular to the direction of the bitlines.

A further increase in the integration density is achieved by arranging terminal areas which are arranged between the first bitline and the second bitline on a geometrical connecting line which extends parallel to the bitlines. The fact that there are arranged between the first bitline and the second bitline both terminal areas which adjoin drain areas of MOS transistors along the first bit line, and terminal areas which adjoin drain areas of MOS transistors along the second bitline, results in the smallest possible spacing between adjacent bitlines.

Moreover, MOS transistors arranged along a third bitline, which is adjacent to the second bitline on the side averted from the first bitline, and whose drain area is adjoined by the terminal area on the side facing the second bitline, and MOS transistors arranged along the first bitline and whose drain area is adjoined by the terminal area on the side facing the second bitline are arranged offset relative to one another in such a way that the terminal areas facing the second bitline are arranged respectively in pairs along a geometrical connecting line which extends parallel to the wordlines.

In this arrangement, the arrangement of the MOS transistor pairs along a bitline is repeated in each fourth bitline. The bitline contacts on adjacent bitlines are correspondingly offset relative to one another by ¼ of the spacing which adjacent bitline contacts on one and the same bitline have. Such a quarter-pitched arrangement is advantageous both with regard to the utilization of the available area and with regard to the process reliability during opening of the bitline contacts.

By contrast with the folded-bitline arrangement, it is necessary in the quarter-pitched arrangement for a read amplifier in each case to compare one bitline with a neighbour next but one, since here 2 active and 2 inactive bitlines follow one another in each case.

A quarter-pitched arrangement is disclosed by S. Yoshikawa et al, Symp. on VLSI-Technol. 1989, pages 67 ff for the purpose of arranging another type of memory cells which in each case comprise a selection transistor and a trench capacitor, realised in the substrate, a storage capacitor.

Given the field isolation of the active areas with respect to one another, a uniform isolation spacing can be realised in the DRAM arrangement according to the invention with a quarter-pitched layout. This permits the use of trench isolations as field isolations, without in the process having to fear problems due to a non-uniform trench width.

The DRAM arrangement according to the invention is particularly advantageous for buried-bitline-stacked-capacitor (BBSTC) DRAM cells.

Further embodiments of the invention include the DRAM cell arrangement in which the terminal areas adjoining the drain areas of a transistor pair are arranged on opposite sides of the associated bitline. This arrangement may have the transistor pairs respectively arranged along each bitline in such a way that the terminal areas which adjoin mutually facing drain areas of adjacent transistor pairs are arranged on respectively opposite sides of the associated bitline. In a further development, the wordlines extend perpendicular to the bitlines, the transistor pairs along a first bitline are arranged offset relative to the transistor pairs along a second bitline, which is adjacent to the first bitline, in such a way that the gate electrodes, respectively arranged above the channel area, of those MOS transistors along the first bitline on whose drain areas the terminal areas on the side averted from the second bitline are arranged, and the gate electrodes of those transistors along the second bitline on whose drain areas the terminal areas on the side averted from the first bitline are arranged, are arranged in pairs along a wordline in each case.

As yet a further development, the arrangement has, between the first bitline and the second bitline, terminal areas which adjoin drain areas of transistor pairs along the first bitline, and terminal areas, which adjoin drain areas of transistor pairs along the second bitline arranged on a geometrical connecting line which extends parallel to the bitlines, in which transistor pairs arranged along a third bitline, which is adjacent to the second bitline on the side averted from the first bitline, and whose drain area is adjoined by the terminal area on the side facing the second bitline, and transistor pairs arranged along the first bitline and whose drain area is adjoined by the terminal area on the side facing the second bitline are arranged offset relative to one another in such a way that the terminal areas facing the second bitline are arranged respectively in pairs along a geometrical connecting line which extends parallel to the wordlines.

Preferably, the width of the bitlines and the spacing of the bitlines are substantially the same, and the width of the wordlines and the spacing of the wordlines are substantially the same.

The memory element of the arrangement is a storage capacitor having storage nodes, a dielectric and cell plate and is arranged above the wordline plane and the bitline plane. The dielectric is arranged as a continuous layer above the storage nodes and the cell plate is arranged as a continuous layer above the dielectric.

In each case, one drain area and the adjoining terminal area are constructed as a continuous doped area in a substrate. Preferably, the MOS transistors of a transistor pair have a common source area.

The invention is explained in more detail below with the aid of an exemplary embodiment and of the figures.

DETAILED DESCRIPTION OF THE PREFERRED EMBODIMENTS

Figure 1:
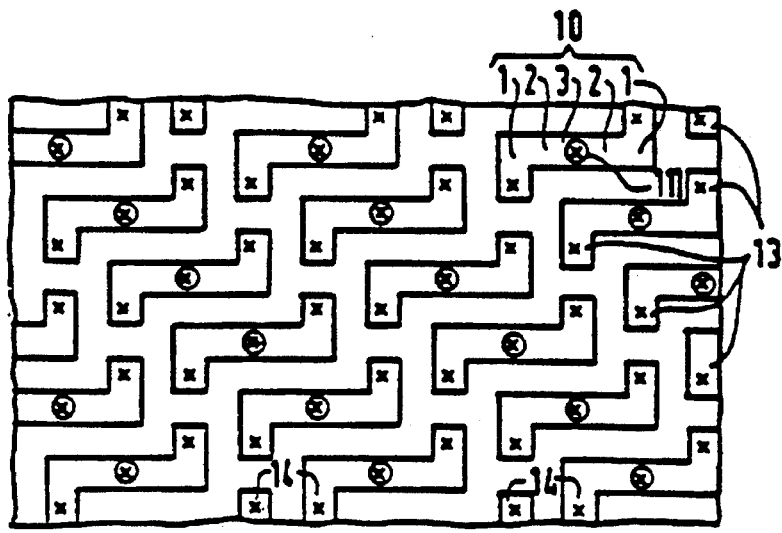
FIG. 1 shows a section through a DRAM cell arrangement parallel to the surface of the substrate in the plane of field isolation/active areas.

Arranged in a substrate are a multiplicity of MOS transistors which in each case are a selection transistor of a memory cell. Each MOS transistor comprises a drain area 1, a channel area 2 with a associated gate electrode, and a source area 3 (see FIG. 1). Two MOS transistors each are constructed as a transistor pair 10, a drain area 1, channel area 2 and source area 3 being rectilinearly arranged in each case. The MOS transistors a transistor pair 10 are arranged in this case in mirror-image fashion relative to one another. They meet with their source area 3. They have a common source area 3.

Figure 2:
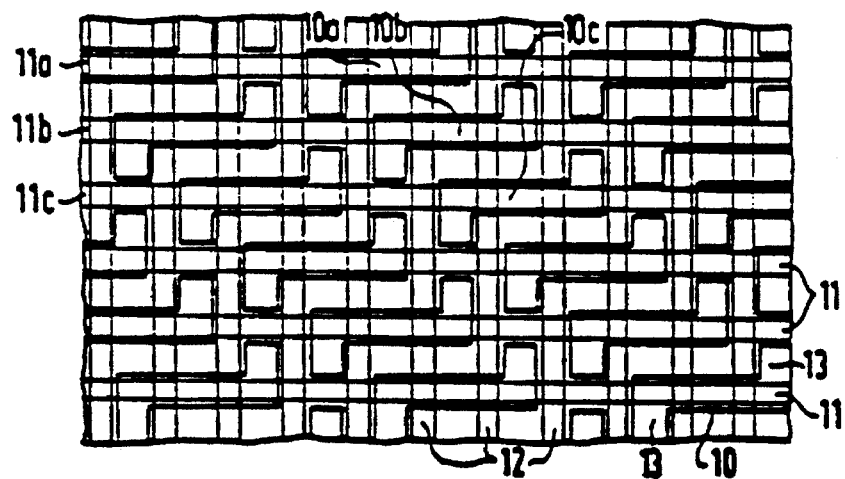
FIG. 2 shows a layout of a word and bitline plane and the plane of the field isolation/active areas of the MOS transistors.

The transistor pairs 10 are in each case aligned in the direction of bitlines 11 extending in a bitline plane (see FIG. 2). The transistor pairs 10 are respectively arranged in this case essentially below an associated bitline 11.

Wordlines 12 extend in a wordline plane perpendicular to the bitlines 11 (see FIG. 2). The wordlines 12 are each arranged above the channel area 2 and connected to the associated gate electrode. They extend perpendicular to the rectilinear arrangement of the drain area 1, the channel area 2 and the source area 3.

The common source area 3 of each transistor pair 10 is electrically connected to the associated bitline 11 via a bitline contact 111. Terminal areas 13 are arranged adjoining the drain areas 1 in the substrate. The terminal areas 13 are arranged to the side of the bitlines 11. The terminal areas 13 on the drain areas 1 of a transistor pair 10 are respectively arranged in this case on opposite sides of the associated bitline 11.

The transistor pairs 10 are respectively arranged along each bitline 11 in such a way that the terminal areas 13 which adjoin transistor pairs 10 adjacent to mutually facing drain areas 1 are arranged on respectively opposite sides of the associated bitline 11.

A cell contact to a memory element which is arranged above the bitline plane and the wordline plane is provided via the terminal areas 13. The memory element comprises, for example, a storage capacitor having storage nodes, a dielectric and a cell plate. In this case, the dielectric and the cell plate are arranged above the storage nodes, for example as continuous layers.

The terminal areas 13 and the associated drain areas 1 are constructed in the substrate as a continuous doped area.

The transistor pairs 10a along a first bitline 11a are arranged offset relative to the transistor pairs 10b along a second bitline 11b, which is adjacent to the first bitline 11a, in such a way that the gate electrodes of those MOS transistors along the first bitline 11a, on whose drain areas 1 the terminal areas 13 on the side averted from the second bitline 11b are arranged, and the gate electrodes of those transistors along the second bitline 11b, on whose drain areas 1 the terminal areas on the side averted from the first bitline 11a are arranged, are arranged respectively in pairs along a wordline 12.

Those terminal areas 13 which are arranged between the first bitline 11a and the second bitline 11b and which adjoin drain areas 1 of MOS transistors along the first bitline 11a, on the one hand, and drain areas 1 of MOS transistors along the second bitline 11b, on the other hand, are arranged on a geometrical connecting line which extends parallel to the bitlines 11.

Transistor pairs 10c which are arranged along a third bitline 11c, which is adjacent to the second bitline 11b on the side averted from the first bitline 11a, and have an MOS transistor whose drain area is adjoined by the terminal area on the side facing the second bitline 11b, and transistor pairs 10a which are arranged along the first bitline 11a and have MOS transistors whose drain area 1 is adjoined by the terminal area 13 on the side facing the second bitline 11b are arranged offset relative to one another in such a way that the terminal areas 13 facing the second bitline 11b are respectively arranged in pairs along a geometrical connecting line which extends parallel to the wordlines 12.

Figure 3:
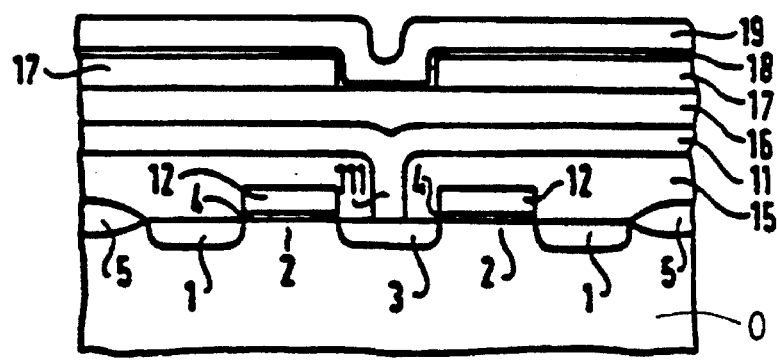
FIG. 3 shows a section through a transistor pair of a DRAM cell arrangement according to the invention.

FIG. 3 shows a section through a transistor pair 10 of a DRAM cell arrangement according to the invention. The section in FIG. 3 is represented in this case on a different scale than in FIG. 1 and FIG. 2. The active areas are realised as a transistor pair in the substrate 0 for two MOS transistors. In this case, the drain areas 1, the channel areas 2 and a common source area 3 are arranged in the substrate 0. The drain area 1, the channel area 2, the source area 3, the further channel area 2 and the further drain area 1 of a transistor pair are linearly arranged in this case. Gate oxides 4 are arranged on the surface of the channel areas 2. Gate electrodes arranged above the gate oxides 4 are connected to wordlines 12 which extend perpendicular to the plane of section over the cell arrangement. The active areas of the transistor pairs are isolated from one another by field oxide areas 5.

Realised in an isolation layer 15 which isolates the drain areas 1 and the wordlines 12 from the bitlines 11 are bitline contacts 111 between bitlines 11, extending above the isolation layer 15, and the source area 3.

Storage nodes 17 of, for example, doped polysilicon are arranged separated from the bitlines 11 by an isolation layer 16. The storage nodes 17 are respectively arranged above an MOS transistor. Adjacent storage nodes 17 are interrupted above the bitline contacts 111.

The storage nodes 17 are covered over their entire area by a storage dielectric 18, for example a sequence of layers of thermal $SiO_2$, $Si_3N_4$ and thermal $SiO_2$. The Storage dielectric 18 is covered over its entire area by a cell plate 19 of, for example, doped polysilicon.

The storage nodes 17 are electrically connected to the drain areas 1 via cell contacts 14, which are not visible in the section shown in FIG. 3, and the terminal areas 13 which are likewise not visible in the section shown in FIG. 3.

Although other modifications and changes may be suggested by those skilled in the art, it is the intention of the inventor to embody within the patent warranted hereon all changes and modifications as reasonably and properly come within the scope of his contribution to the art.

I claim:

1. A DRAM cell arrangement, comprising:

a substrate, bitlines arranged in a bitline plane and word lines arranged in a wordline plane on said substrate, memory cells in said substrate, said memory cells each comprising a cell transistor and a memory element, said cell transistors being MOS transistors that are constructed as transistor pairs in two respective memory cells in said substrate, said transistor pairs including source areas connected to one another, common bitline contacts connecting respective ones of said bitlines to said source areas, said MOS transistors having their drain areas, channel areas and source areas in a linear arrangement which is aligned in a direction of said bitlines and that is below an associated one of said bitlines, terminal areas, each of said terminal areas adjoining a corresponding one said drain areas, said terminal areas being cell contacts between said cell transistors and said memory elements, wherein each one of said drain areas and an adjoining one of said terminal areas are a continuous doped area in said substrate, and said terminal areas each being to a side of an associated one of said bitlines, and wherein said terminal areas adjoining said drain areas of said transistor pair are on opposite sides of the associated one of said bitlines.

2. A DRAM cell arrangement according to claim 1, wherein said transistor pairs are respectively arranged along each of said bitlines in such a way that said terminal areas which adjoin mutually facing ones of said drain areas of adjacent ones of said transistor pairs are arranged on respectively opposite sides of the associated one of said bitlines.

3. A DRAM cell arrangement according to claim 2, wherein said transistors have gate electrodes above said channel areas, said wordlines extend perpendicular to said bitlines, first transistors pairs of said transistor pairs along a first bitline of said bitlines are arranged offset relative to second transistor pairs of said transistor pairs along a second bitline of said bitlines which is adjacent to said first bitline in such a way that said gate electrodes above said channel areas of MOS transistors of said first transistor pairs along said first bitline on whose drain areas said terminal areas on a side averted from said second bitline are arranged, and said gate electrodes of transistors of said second transistor pairs along said second bitline on whose drain areas said terminal areas on a side averted from said first bitline are arranged, are arranged in pairs along ones of said wordlines in each case.

4. A DRAM cell arrangement according to claim 3, wherein between said first bitline and said second bitline terminal areas which adjoin drain areas of said first transistor pairs along said first bitline, and terminal areas, which adjoin drain areas of said second transistor pairs along said second bitline are arranged on a geometrical connecting line which extends parallel to said bitlines, third transistor pairs of said transistor pairs arranged along a third bitline of said bitlines, said third bitline being adjacent to said second bitline on a side averted from said first bitline, and whose drain area is adjoined by the terminal area on a side facing said second bitline, and said first transistor pairs arranged along said first bitline and whose drain area is adjoined by the terminal area on the side facing said second bitline are arranged offset relative to one another in such a way that the terminal areas facing said second bitline are arranged respectively in pairs along a geometrical connecting line which extends parallel to said wordlines.

5. A DRAM cell arrangement according to claim 4, wherein said bitlines are of a width that is substantially equal to a spacing between said bitlines, said wordlines are of a width that is substantially equal to a spacing between said wordlines.

6. A DRAM cell arrangement according to claim 1, further comprising:

a storage capacitor having storage nodes, a dielectric and a cell plate being a memory element above said wordline plane and said bitline plane.

7. A DRAM cell arrangement according to claim 6, wherein said dielectric is a continuous layer above said storage nodes and said cell plate is a continuous layer above said dielectric.

8. A DRAM cell arrangement according to claim 1, wherein said MOS transistors of said transistor pairs have a common source area.

* * * * *